United States Patent
Isaksson

(10) Patent No.: US 11,745,592 B2
(45) Date of Patent: Sep. 5, 2023

(54) METHOD FOR DETECTING AN ISOLATION FAULT

(71) Applicant: Ningbo Geely Automobile Research & Development Co., Ltd., Ningbo (CN)

(72) Inventor: Björn Isaksson, Uddevalla (SE)

(73) Assignee: NINGBO GEELY AUTOMOBILE RESEARCH & DEVELOPMENT CO., Ningbo (CN)

( * ) Notice: Subject to any disclaimer, the term of this patent is extended or adjusted under 35 U.S.C. 154(b) by 423 days.

(21) Appl. No.: 17/151,358

(22) Filed: Jan. 18, 2021

(65) Prior Publication Data

US 2021/0129675 A1    May 6, 2021

Related U.S. Application Data

(63) Continuation of application No. PCT/CN2019/099193, filed on Aug. 5, 2019.

(30) Foreign Application Priority Data

Aug. 6, 2018   (EP) .................................... 18187507

(51) Int. Cl.
   *G01R 31/00*     (2006.01)
   *B60L 3/00*      (2019.01)
   (Continued)

(52) U.S. Cl.
   CPC ........... *B60L 3/0069* (2013.01); *B60L 3/0046* (2013.01); *B60L 3/04* (2013.01); *B60L 53/20* (2019.02);
   (Continued)

(58) Field of Classification Search
   CPC ...... G01R 31/006; G01R 31/14; G01R 31/52; B60L 3/0069; B60L 3/0046; B60L 3/04;
   (Continued)

(56) References Cited

U.S. PATENT DOCUMENTS

| 8,635,033 B2 | 1/2014 | Hasan |
| 9,263,948 B1 | 2/2016 | Vovos |

(Continued)

FOREIGN PATENT DOCUMENTS

EP    2869075 A1    5/2015

OTHER PUBLICATIONS

International Search Report from corresponding International Application No. PCT/CN2019/099193, dated Oct. 30, 2019, 2 pages.

*Primary Examiner* — Patrick Assouad
*Assistant Examiner* — Demetrius R Pretlow
(74) *Attorney, Agent, or Firm* — Tucker Ellis LLP

(57) ABSTRACT

A method for detecting an isolation fault in an isolation resistance between a positive and negative high-voltage bus rail and a vehicle chassis on a high-voltage propulsion side of a high-voltage system of an electric or hybrid-electric vehicle. The high-voltage system is split into a battery side and propulsion side by means of two high-voltage contactors located in the positive and negative high-voltage bus rails. The propulsion side includes first and second capacitors connected in series across the positive and negative bus rails, a common junction of the first and second capacitors connected to the chassis. The method supplies a low-voltage output to the positive and negative bus rails to charge the capacitors; and determines, based on charging current, voltage level or energy level of the capacitors, whether an isolation fault is present between the positive and/or negative high-voltage bus rail and the vehicle chassis on the propulsion side.

15 Claims, 6 Drawing Sheets

(51) Int. Cl.

| | |
|---|---|
| *B60L 53/20* | (2019.01) |
| *B60L 3/04* | (2006.01) |
| *B60R 16/03* | (2006.01) |
| *G01R 31/14* | (2006.01) |
| *G07C 5/08* | (2006.01) |
| *H02H 1/00* | (2006.01) |
| *H02H 11/00* | (2006.01) |
| *H02M 3/335* | (2006.01) |

(52) U.S. Cl.
CPC ............ *B60R 16/03* (2013.01); *G01R 31/006* (2013.01); *G01R 31/14* (2013.01); *G07C 5/0808* (2013.01); *H02H 1/0007* (2013.01); *H02H 11/005* (2013.01); *H02M 3/33569* (2013.01); *B60L 2210/10* (2013.01)

(58) Field of Classification Search
CPC ...... B60L 53/20; B60L 2210/10; B60R 16/03; G07C 5/0808; H02H 1/0007; H02H 11/005; Y02T 90/14
See application file for complete search history.

(56) References Cited

U.S. PATENT DOCUMENTS

| | | | |
|---|---|---|---|
| 9,579,977 B2* | 2/2017 | Gale | G01R 31/52 |
| 10,161,982 B2* | 12/2018 | Inamoto | G01R 31/40 |
| 2003/0155928 A1* | 8/2003 | Roden | B60L 3/04 |
| | | | 324/509 |
| 2007/0013382 A1* | 1/2007 | Hinz | B60L 3/0053 |
| | | | 429/9 |
| 2009/0278547 A1* | 11/2009 | Acena | G01R 31/52 |
| | | | 702/58 |
| 2011/0049977 A1* | 3/2011 | Onnerud | B60L 3/0046 |
| | | | 307/9.1 |
| 2011/0175619 A1 | 7/2011 | Bauer | |
| 2011/0291662 A1* | 12/2011 | Wang | H02P 29/0241 |
| | | | 324/537 |
| 2012/0280697 A1* | 11/2012 | Morimoto | B60L 3/0069 |
| | | | 324/606 |
| 2013/0300430 A1* | 11/2013 | Lindsay | B60L 58/21 |
| | | | 324/522 |
| 2014/0333321 A1* | 11/2014 | Kawamura | G01R 27/18 |
| | | | 324/509 |
| 2015/0022217 A1* | 1/2015 | Wang | B60L 50/51 |
| | | | 324/539 |
| 2015/0219706 A1* | 8/2015 | Loftus | B60L 58/20 |
| | | | 324/503 |
| 2016/0091551 A1 | 3/2016 | Sun | |
| 2016/0258993 A1* | 9/2016 | Bagchi | G01R 31/52 |
| 2017/0102432 A1* | 4/2017 | Foley | G01R 31/389 |
| 2018/0164361 A1* | 6/2018 | Premerlani | B60L 50/10 |
| 2018/0164362 A1* | 6/2018 | Premerlani | G01R 31/52 |
| 2019/0047436 A1* | 2/2019 | Song | G08B 21/18 |
| 2019/0086464 A1* | 3/2019 | Kawamura | G01R 27/025 |
| 2019/0184833 A1* | 6/2019 | Elshaer | B60L 53/22 |
| 2021/0172996 A1* | 6/2021 | Sevel | G01R 27/025 |
| 2021/0276424 A1* | 9/2021 | Berry | B60L 3/0069 |

* cited by examiner

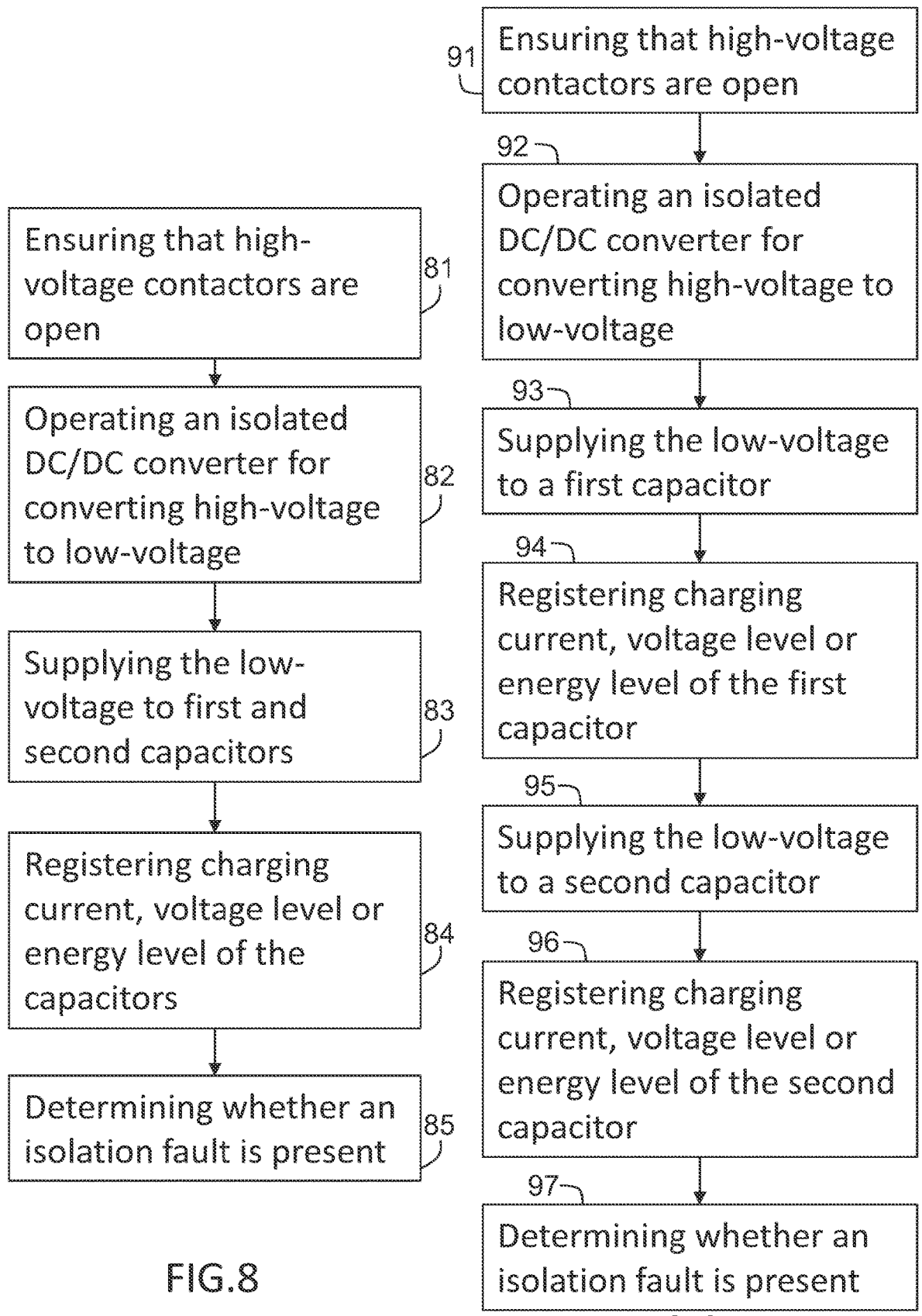

METHOD FOR DETECTING AN ISOLATION FAULT

RELATED APPLICATION DATA

This application is a continuation of International Patent Application No. PCT/CN2019/099193, filed Aug. 5, 2019, which claims the benefit of European Patent Application No. 18187507.1, filed Aug. 6, 2018, the disclosures of which are incorporated herein by reference in their entireties.

TECHNICAL FIELD

The disclosure relates to method for detecting an isolation fault in an isolation resistance between a positive and negative high-voltage bus rail and a vehicle chassis on a high-voltage propulsion side of a high-voltage system of an electric or hybrid-electric vehicle. The disclosure also relates to a corresponding high-voltage circuit.

The disclosure can be arranged in a high-voltage system of an electric or hybrid-electric vehicle, such as for example a car, a trucks, a bus, a marine vessel, a work vehicle such as wheel loader, excavator, dumper, compacting machine or forest machine, an off-road vehicle, or the like.

BACKGROUND

High-voltage systems of an electric or hybrid-electric vehicle typically enables improved fuel economy, faster charging, improved dynamic response and reduced electrical currents. High-voltage systems are generally fastened to the vehicle chassis but there must be a minimum isolation resistance between a positive and negative high-voltage bus rail and a vehicle chassis to ensure safety during for example operation or service.

It is known to provide safety systems for monitoring the isolation resistance and to take appropriate action when an isolation fault is detected. However, improvements of conventional isolation resistance monitoring systems in terms of rapid isolation resistance testing, reduced complexity and safety are still possible.

SUMMARY

This section provides a general summary of the disclosure, and is not a comprehensive disclosure of its full scope or all of its features.

A general object of the present disclosure is to provide a method and high-voltage circuit for detecting an isolation fault in an isolation resistance between a positive and negative high-voltage bus rail and a vehicle chassis on a high-voltage propulsion side of a high-voltage system of an electric or hybrid-electric vehicle, which method and circuit provides improved performance in terms of rapid isolation resistance testing, reduced complexity and improved safety.

This and other objects, which will become apparent in the following, are at least partly accomplished by the method and system as defined in the accompanying independent claims.

According to a first aspect of the present disclosure, there is provided a method for detecting an isolation fault in an isolation resistance between a positive and negative high-voltage bus rail and a vehicle chassis on a high-voltage propulsion side of a high-voltage system of an electric or hybrid-electric vehicle. The high-voltage system is split into a high-voltage battery side and the high-voltage propulsion side by means of first and second high-voltage contactors located in the positive and negative high-voltage bus rails, respectively. Furthermore, the high-voltage propulsion side comprises a first and second capacitors connected in series across the positive and negative high-voltage bus rails, and a common junction of the first and second capacitors is connected to the chassis. The method comprising the steps of: ensuring that first and second high-voltage contactors are set in an open state, operating an isolated DC/DC converter for converting a supplied high-voltage from a high-voltage battery of the high-voltage battery side to a low-voltage output on the high-voltage propulsion side, supplying the low-voltage output to the positive and negative high-voltage bus rails for simultaneous charging of the first and second capacitors, registering a charging current, voltage level or energy level of the first and second capacitors, and determining, based in the registered charging current, voltage level or energy level of the first and second capacitors, whether an isolation fault between the positive and/or negative high-voltage bus rail and the vehicle chassis on the high-voltage propulsion side of the high-voltage system is present.

According to a second aspect of the present disclosure, there is provided a method for detecting an isolation fault in an isolation resistance between a positive and negative high-voltage bus rail and a vehicle chassis on a high-voltage propulsion side of high-voltage system of an electric or hybrid-electric vehicle. The high-voltage system is split into a high-voltage battery side and the high-voltage propulsion side by means of first and second high-voltage contactors located in the positive and negative high-voltage bus rails, respectively. The high-voltage propulsion side comprises a first and second capacitors connected in series across the positive and negative high-voltage bus rails, and a common junction of the first and second capacitors is connected to the chassis. The method comprising: ensuring that first and second high-voltage contactors are set in an open state, operating an isolated DC/DC converter for converting a supplied high-voltage from a high-voltage battery of the high-voltage battery side to a low-voltage output on the high-voltage propulsion side, supplying the low-voltage output to the first capacitor for charging of the first capacitor, registering a charging current, voltage level or energy level of the first capacitor, supplying the low-voltage output to the second capacitor for charging of the second capacitor, registering a charging current, voltage level or energy level of the second capacitor, and determining, based in the registered charging current, voltage level or energy level of the first and second capacitors, whether an isolation fault between the positive and/or negative high-voltage bus rail and the vehicle chassis on the high-voltage propulsion side of the high-voltage system is present.

According to a third aspect of the present disclosure, there is also provided a high-voltage circuit of an electric or hybrid-electric vehicle. The high-voltage circuit comprising: a high-voltage battery side including a high-voltage battery, a high-voltage propulsion side including an electrical propulsion motor and a motor controller associated with electrical propulsion motor, a positive and a negative high-voltage bus rail connecting the high-voltage battery with the motor controller, a first and a second high-voltage contactor located in the positive and the negative high-voltage bus rail, respectively, and defining a split between the high-voltage battery side and the high-voltage propulsion side, a first and a second capacitor located on the high-voltage propulsion side and connected in series across the positive and negative high-voltage bus rails, wherein a common junction of the first and second capacitors is connected to the chassis, an isolated DC/DC converter having a high-voltage input connected to the high-voltage battery and a low-voltage output connected to the positive and negative high-voltage bus rails on the high-voltage propulsion side, and an electronic controller configured for operating the isolated DC/DC converter and detecting an isolation fault in an isolation resistance between the positive and negative high-voltage bus rail and the vehicle chassis on the high-voltage propulsion side while having the first and second high-voltage contactors set in an open state.

In this way, several advantages are accomplished. First, the first and second high-voltage contactors may remain in an open state during the test sequence for detecting an isolation fault. This fact, together with the isolated DC/DC converter for converting a supplied high-voltage from a high-voltage battery to a low-voltage output on the high-voltage propulsion side, it is ensured that the test sequence for detecting an isolation fault may be performed in absence of regulatory "high-voltage", i.e. below 60 Volt. This means significantly improved safety for users or service personnel since no hazardous electrical currents are available in case of severe isolation fault.

Second, by providing simultaneous charging of the first and second capacitors, and determining based in the registered charging current, voltage level or energy level of the first and second capacitors, whether an isolation fault between the positive and/or negative high-voltage bus rail and the vehicle chassis on the high-voltage propulsion side of the high-voltage system is present, a very rapid and non-complex test sequence may be implemented. This means that a faulty high-voltage circuit can be quickly closed down and a vehicle start-up sequence may be performed with less delay and with improved cost-efficiency.

Further advantages are achieved by implementing one or several of the features of the dependent claims.

In an example embodiment, the step of determining whether an isolation fault is present is performed by determining a difference in timing until the first and second capacitors, respectively, has reached a predetermined charging current, voltage level or energy level, and if the difference is larger than a predetermined threshold value determine that an isolation fault is present. This evaluation approach may be relatively cost-efficiently implemented using an optocoupler, comparator or the like that that simply indicates when a threshold current, voltage or energy level has been reached, in combination with a timer.

In another example embodiment, the step of determining whether an isolation fault is present is performed by determining a difference in charging current, voltage level or energy level of the first and second capacitors after a predetermined time period, and if the difference is larger than a predetermined threshold value determine that an isolation fault is present. This evaluation approach may provide more relevant test data that may be used for determining the severity of a detected isolation fault.

In still another example embodiment, the step of determining whether an isolation fault is present is performed by determining a difference in a registered charging current characteristic over time, voltage level characteristic over time or energy level characteristic over time of the first and second capacitors, and if the difference is larger than a predetermined threshold value determine that an isolation fault is present. A registered charging current characteristic over time, voltage level characteristic over time or energy level characteristic over time may for example be represented using a plurality of measurement points of the charging current, voltage level or energy level over time. This evaluation approach may thus provide even more relevant test data that may be used for determining the severity and type of a detected isolation fault.

In an example embodiment, the step of determining whether an isolation fault is present includes classifying a detected isolation fault in one of at least two isolation fault classes representing different levels of isolation fault severity. Thereby different actions may be taken depending on the severity of the isolation resistance fault.

In an example embodiment, the method further comprising preventing closing of the first and second high-voltage contactors when a detection isolation fault is classified in a high severity class, and allowing closing of the first and second high-voltage contactors when a detected isolation fault is classified in a low severity class. Thereby the risk for hazardous electrical chock to a user or service personnel can be avoided in case of severe isolation resistance fault while still allowing mobility and time for vehicle service in case of less severe isolation resistance fault.

In an example embodiment, the method additionally comprises presenting information to a user of the vehicle about the detection isolation fault when a detected isolation fault is classified in a low severity class. Thereby the user can organise vehicle service at an early stage before the isolation fault becomes more severe.

In an example embodiment, the isolated DC/DC converter includes an electrical transformer for converting the supplied high-voltage from the high-voltage battery to the low-voltage output. Use of an electrical transformer enables a cost-efficient high-isolating layout of the DC/DC converter.

In an example embodiment, the isolated DC/DC converter has an isolated topology in form of Flyback, Forward, Push-Pull, Half-Bridge or Resonant LLC topology.

In an example embodiment, the method comprises: controlling an electrical power level that is transferred from a primary side of the DC/DC converter to a secondary side of the DC/DC converter by means of the electronic controller, and supplying feedback information regarding charging current, voltage level or energy level of each of the first and second capacitors to the electronic controller by means of an isolated sensing circuit. Thereby the electronic controller can be programmed to perform reliable estimation of the isolation resistance status.

In an example embodiment, the isolated sensing circuit is implemented by means of an optocoupler or a digital isolator device on an integrated circuit. Thereby a cost-efficient solution for providing feedback to the electronic controller can be accomplished, while ensuring that no high-voltage is delivered to the high-voltage propulsion side during the isolation resistance test sequence.

In an example embodiment, the step of operating an isolated DC/DC converter for converting a supplied high-voltage from a high-voltage battery of the high-voltage battery side to a low-voltage output on the high-voltage propulsion side involves executing a first pulse width modulation process, and if an isolation fault is detected, executing a second pulse width modulation process. Thereby more information about the isolation fault may be acquired, such that a better estimation of the degree of severity of the isolation resistance fault can be performed.

In one example embodiment, the supplied high-voltage has a voltage level of at least 300 Volt, specifically at least 400 Volt, and more specifically at least 500 Volt. Higher voltage generally enables increased power output.

In one example embodiment, the low-voltage output has voltage below 60 Volt, specifically below 30 Volt. Thereby the risk for hazardous electrical shock to a user is reduced in case of isolation resistance fault.

In an example embodiment, the method comprises disconnecting the isolated sensing circuit from the first and second capacitors when no detection of an isolation fault in an isolation resistance between a positive and negative high-voltage bus rail and a vehicle chassis is performed. Thereby power dissipation within the isolated sensing circuit may be reduced during times when the isolated sensing circuit is not used.

In an example embodiment, the electronic controller is configured for controlling an electrical power level that is transferred from a primary side of the DC/DC converter to a secondary side of the DC/DC converter, and wherein the high-voltage circuit further comprises an isolated sensing circuit configured for supplying feedback information regarding charging current, voltage level or energy level of each of the first and second capacitors to the electronic controller. Thereby the electronic controller can be programmed to perform reliable estimation of the isolation resistance status.

In an example embodiment, the high-voltage circuit further comprising a switch located in the isolated sensing circuit for enabling disconnection of the isolated sensing circuit from the first and second capacitors when no detection of an isolation fault in an isolation resistance between a positive and negative high-voltage bus rail and a vehicle chassis is performed. Thereby power dissipation within the isolated sensing circuit may be reduced during times when the isolated sensing circuit is not used.

In an example embodiment, the electronic controller is configured for: ensuring that first and second high-voltage contactors are set in an open state, operating an isolated DC/DC converter for converting a supplied high-voltage from a high-voltage battery of the high-voltage battery side to a low-voltage output on the high-voltage propulsion side, supplying the low-voltage output to the positive and negative high-voltage bus rails for simultaneous charging of the first and second capacitors, registering a charging current, voltage level or energy level of the first and second capacitors, and determining, based in the registered charging current, voltage level or energy level of the first and second capacitors, whether an isolation fault between the positive and/or negative high-voltage bus rail and the vehicle chassis on the high-voltage propulsion side of the high-voltage system is present. This test sequence enables a quick and straightforward test of the isolation resistance status.

In a further example embodiment, the electronic controller is configured for: ensuring that first and second high-voltage contactors are set in an open state, operating an isolated DC/DC converter for converting a supplied high-voltage from a high-voltage battery of the high-voltage battery side to a low-voltage output, supplying the low-voltage output to the first capacitor for charging of the first capacitor, registering a charging current, voltage level or energy level of the first capacitor, supplying the low-voltage output to the second capacitor for charging of the second capacitor, registering a charging current, voltage level or energy level of the second capacitor, and determining, based in the registered charging current, voltage level or energy level of the first and second capacitors, whether an isolation fault between the positive and/or negative high-voltage bus rail and the vehicle chassis on the high-voltage propulsion side of the high-voltage system is present. This test sequence enables a reliable and accurate test of the isolation resistance status.

Further features of, and advantages with, the present disclosure will become apparent when studying the appended claims and the following description. The skilled person realize that different features of the present disclosure may be combined to create embodiments other than those described in the following, without departing from the scope of the present disclosure.

BRIEF DESCRIPTION OF THE DRAWINGS

The various example embodiments of the disclosure, including its particular features and example advantages, will be readily understood from the following illustrative and non-limiting detailed description and the accompanying drawings, in which:

FIGS. 8 and 9 show two alternative embodiments of a flowchart of the method for detecting an isolation fault in an isolation resistance according to the disclosure.

DETAILED DESCRIPTION

Figure 1:
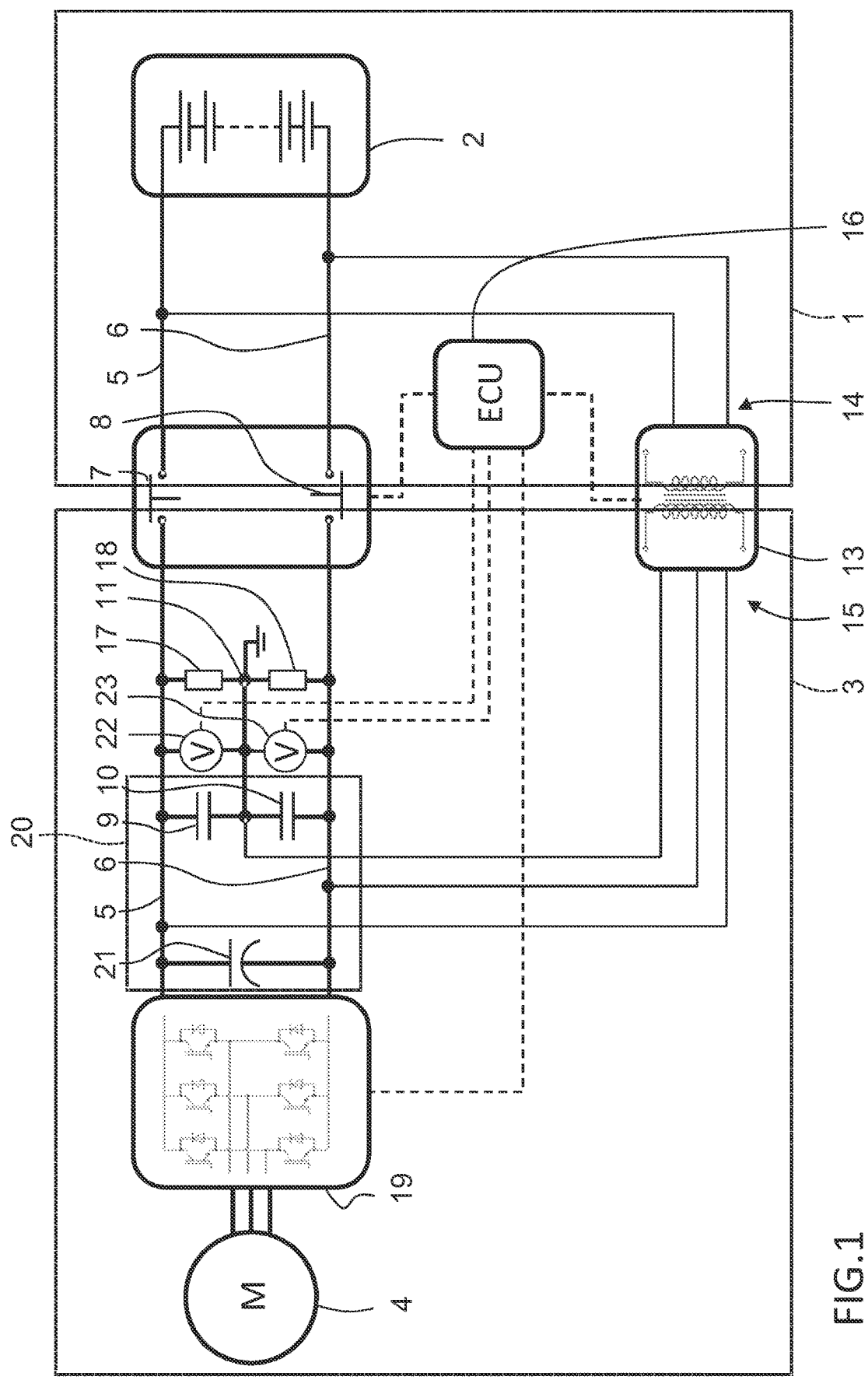
FIG. 1 shows a schematic overview of an example embodiment of the layout of the high-voltage circuit according to the disclosure.

The present disclosure will now be described more fully hereinafter with reference to the accompanying drawings, in which exemplary embodiments of the disclosure are shown. The disclosure may, however, be embodied in many different forms and should not be construed as limited to the embodiments set forth herein; rather, these embodiments are provided for thoroughness and completeness. Like reference characters refer to like elements throughout the description. The drawings are not necessarily to scale and certain features may be exaggerated in order to better illustrate and explain the exemplary embodiments of the present disclosure.

Referring now to FIG. 1, there is schematically illustrated an example embodiment of a high-voltage circuit of an electric or hybrid-electric vehicle according to the disclosure.

The high-voltage circuit comprises a high-voltage battery side 1 including a high-voltage battery 2. The high-voltage battery 2 may be of any type, such as for example lead-acid, NiCd, nickel-metal hydride, lithium-ion, Li-ion polymer, etc. The nominal output voltage level of the high-voltage battery 2 may for example be about at least 300 Volt, specifically at least 400 Volt, and more specifically at least 500 Volt.

The high-voltage circuit further comprises a high-voltage propulsion side 3 including an electrical propulsion motor 4 and a motor controller 19 for controlling the operation of the electrical propulsion motor 4. The electrical propulsion motor 4 may for example be a three phase AC motor or a DC motor. If a three phase AC motor is used the motor controller 19 may be an inverter for converting the high-voltage DC supplied from the high-voltage battery 2 to three phase AC supplied to the electrical propulsion motor 4. The high-voltage propulsion side 3 may alternatively include two, three, four or more electrical propulsion motors 4.

The high-voltage circuit further comprises a positive and a negative high-voltage bus rail 5, 6 connecting the high-voltage battery 2 with the motor controller 19. The positive and a negative high-voltage bus rail 5, 6 represent the main electrical conductors electrically connecting the high-voltage battery 2 with the electrical propulsion motor 4, and may for example be made of electrically conducting relatively large area flexible cables, or solid and rigid electrically conducting metal bars.

First and a second high-voltage contactor 7, 8 are provided and located in the positive and the negative high-voltage bus rail 5, 6, respectively. The high-voltage contacts enable selective closing and opening of an electrical supply path from the high-voltage battery 2 to the electrical propulsion motor 4. In other words, the electrical contactors 7, 8 must be set in a closed state for enabling electrical power supply from the high-voltage battery 2 to the electrical propulsion motor 4, while the electrical contactors 7, 8 may be set in an open state for eliminating the risk that a user comes into contact with the high-voltage from the high-voltage battery 2, thereby ensuring safer repair and service of the vehicle.

Operation of the first and second high-voltage contactors 7, 8 may for example be controlled by an electronic controller 16, which for example closes the first and second high-voltage contactors 7, 8 when a user indicates that he/she wishes to start driving the vehicle, and which opens the first and second high-voltage contactors 7, 8 when a user indicates that he/she wishes to stop the driving session.

Opening of the first and second high-voltage contactors 7, 8 during non-operation of the vehicle may be a safety feature for reducing the risk for any types of undesirable electrical incidents, such as hazardous chock to a user or damages/fire due to short-circuiting.

In the present disclosure the first and second high-voltage contactors 7, 8 define a split between the high-voltage battery side 1 and the high-voltage propulsion side 3. In other words, the high-voltage battery side 1 is associated with one side of the first and second high-voltage contactors 7, 8 and the high-voltage propulsion side 3 is associated on the other side of the first and second high-voltage contactors 7, 8, as seen in FIG. 1. In practice, the actual location and of the high-voltage battery 2, the first and second high-voltage contactors 7, 8 and the electrical motor 4 may of course be quite different but the above-mentioned structure is still valid.

The high-voltage circuit further comprises a Electromagnetic Interference (EMI) filter unit 20 having first and a second capacitor 9, 10 located on the high-voltage propulsion side 3 and they are connected in series across the positive and negative high-voltage bus rails 5, 6, wherein a common junction 11 of the first and second capacitors 9, 10 is connected to a chassis 12 of the vehicle.

The first and second capacitors 9, 10 are filter capacitors that serve to filter Common Mode noise. In fact, each of the first and second filter capacitors 9, 10 may, depending on design of the high-voltage circuit, typically represent a plurality of filter capacitors.

The EMI filter unit 20 further has third capacitor 21 connected across the positive and negative high-voltage bus rails 5, 6 and configured for suppressing Differential Mode (DM) noise in the positive and negative high-voltage bus rails 5, 6 with respect to the reference ground plane.

The high-voltage circuit further comprises an isolated DC/DC converter 13 having a high-voltage input 14 connected to the high-voltage battery 2 and a low-voltage output 15 connected to the positive and negative high-voltage bus rails 5, 6 on the high-voltage propulsion side 3.

The supplied high-voltage may for example have a voltage level of at least 300 Volt, specifically at least 400 Volt, and more specifically at least 500 Volt. These voltage levels art conventional voltage levels in the field of hybrid electric and full electric vehicles.

Furthermore, the low-voltage output may have a voltage below 60 Volt, specifically below 30 Volt, for providing significant reduced risk for hazardous shock in case an isolation resistance 17, 18 between the positive and negative high-voltage bus rail 5, 6 and the vehicle chassis 12 on the high-voltage propulsion side 3 is faulty.

The high-voltage circuit further comprises an electronic controller 16 configured for operating the isolated DC/DC converter 13 and detecting an isolation fault in the isolation resistance 17, 18 while having the first and second high-voltage contactors 7, 8 set in an open state.

Due to the isolated DC/DC converter 13, the relatively low-voltage output 15 and having the first and second high-voltage contactors 7, 8 set in an open state during isolation resistance testing, the high-voltage circuit according to the disclosure enables a particularly reduced risk for hazardous electrical shock and damaging short-circuiting during isolation resistance testing.

The isolated DC/DC converter 13 includes an electrical transformer configured for converting a supplied high-voltage from the high-voltage battery 2 to the low-voltage output 15. The electrical transformer, which transfers electrical energy between the high-voltage circuit to the low-voltage circuit through electromagnetic induction, ensures electrical isolation between a primary coil and a secondary coil.

In detail, a varying current in a primary coil of the transformer produces a varying magnetic field, which in turn induces a varying electromotive force in a secondary coil. The varying electromotive force corresponds to a varying voltage in the secondary coil, which voltage is proportional to the number of secondary windings.

Consequently, electrical power can be transferred between from the primary coil to the secondary coil without a metallic connection between the electrical circuit associated with each of the primary and secondary coils, and an output voltage at the secondary coil is determined by a transformer winding voltage ratio between the primary and secondary coils.

The electronic controller 16 is configured for registering a charging current, voltage level or energy level of the first and second capacitors 9, 10 upon supplying the low-voltage to the positive and negative high-voltage bus rails 5, 6 on the high-voltage propulsion side 3.

More in detail, the electronic controller 16 may be configured for registering a rise characteristic over time of the charging current, voltage level or energy level of the first and second capacitors upon supplying the low-voltage output of the isolated DC/DC converter 13 to the positive and negative high-voltage bus rails 5, 6 on the high-voltage propulsion side 3.

The electronic controller 16 may for example be configured for registering a voltage level over the first and second capacitors 9, 10 by means of first and second voltage sensors 22, 23, as illustrated in FIG. 1. Thereby, an isolation resistance fault can be determined as explained below.

At start of the isolation resistance test sequence, the first and second capacitors 9, 10 are generally completely discharged, i.e. has zero voltage, because any electrical charge of the first and second capacitors 9, 10 at time of opening of the first and second high-voltage contactors 7, 8 will discharge over the isolation resistance 17, 18.

In a faultless high-voltage circuit the first and second isolation resistance 17, 18 will have substantially equal resistance values. Moreover, the first and second capacitors 9, 10 of the EMI filter unit 20 will have substantially equal capacitance values. Consequently, if for example the supplied low-voltage to the positive and negative high-voltage bus rails 5, 6 is 15 volt, the voltage level over each of first and second isolation resistance 17, 18 will rise over time from zero to about +15 volt and −15 volt, respectively.

The voltage rise over time characteristic of the first and second capacitors 9, 10 will in a faultless high-voltage circuit have a substantially symmetrical characteristic, meaning that the voltage rise over time of the first capacitor 9 will be substantially identical with the voltage rise over time of the second capacitor 10, but with a different polarity.

Figure 2:
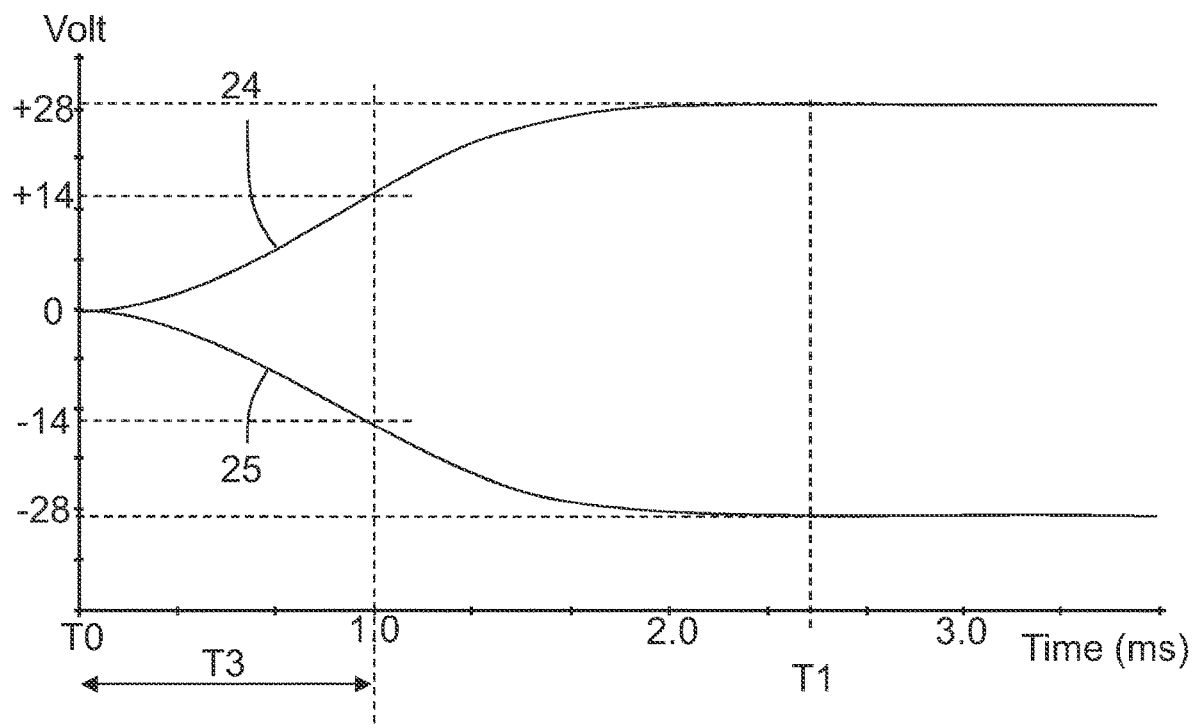
FIGS. 2-3 show a first example embodiment for determining whether an isolation resistance fault is present or not.

This is visualized in FIG. 2, which shows an example embodiment of a substantially symmetrical voltage rise over time characteristic of the first and second capacitors 9, 10 in a faultless high-voltage circuit, wherein a first voltage 24 of the first capacitor 9 at time T0 is zero and at time T1 arrives at about +28 volt and a second voltage 25 of the second capacitor 10 at time T0 is zero and at time T1 arrives at about −28 volt.

For the same reason, in a high-voltage circuit with one of the isolation resistance being faulty, e.g. having a lower resistance value than required, the voltage rise over time characteristic of the first and second capacitors 9, 10 will have a non-symmetrical characteristic, meaning that the voltage rise over time of the first capacitor 9 will be different from the voltage rise over time of the second capacitor 10.

Figure 3:
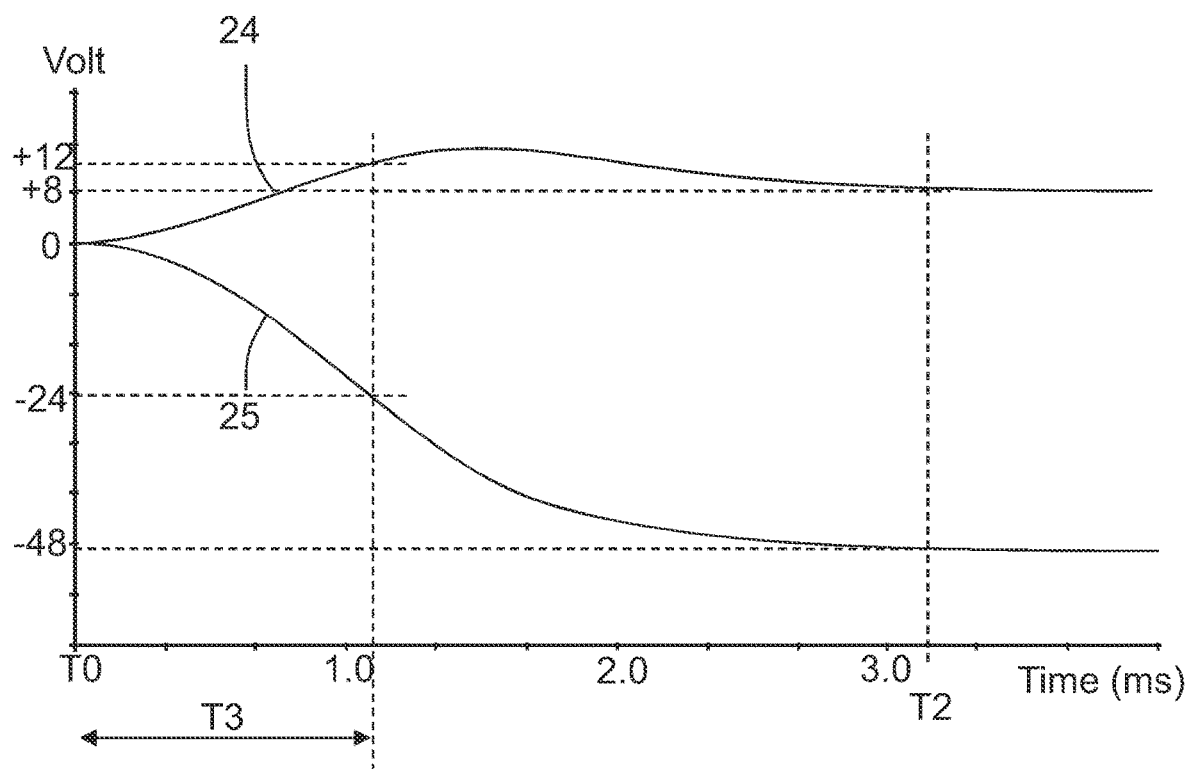

This is visualized in FIG. 3, which shows an example embodiment of a distinctly non-symmetrical voltage rise over time characteristic of the first and second capacitors 9, 10 in a faulty high-voltage circuit, wherein a first voltage 24 of the first capacitor 9 at time T0 is zero and at time T2 arrives at about +8 volt and a second voltage 25 of the second capacitor 10 at time T0 is zero and at time T2 arrives at about −48 volt.

The degree of symmetrically of the voltage rise over time characteristic of the first and second capacitors 9, 10 can be determined by means of the electronic controller 16 in various ways. According to one example embodiment an isolation fault may be determined by registering a difference in voltage level of the first and second capacitors 9, 10 after a predetermined time period from start of the charging sequence, and if the difference is larger than a predetermined threshold value determine that an isolation fault is present.

Such an approach for determining the degree of symmetrically of the voltage rise over time characteristic of the first and second capacitors 9, 10 is illustrated in FIGS. 2 and 3, wherein the difference in voltage level of the first and second capacitors 9, 10 after a predetermined time period T3 from start of the charging sequence is shown in absolute numbers. In FIG. 2, which represent a faultless isolation resistance, the voltage level is +14 volt and −14 volt, respectively, after the time period T3. In other words, there is complete degree of symmetrically of the voltage levels, i.e. no difference in in absolute value of the voltage levels.

However, in FIG. 3, which represent a faulty isolation resistance, the voltage level is +12 volt and −24 volt, respectively, after time period T3. In other words, there is a difference of 12 volts in absolute value of the voltage levels.

Hence, FIG. 3 illustrates an isolation resistance having a relatively large degree of non-symmetrically of the absolute value of the voltage levels.

The time period T3 may typically be set very short, typically less than 1.0 second or even less than 1 millisecond, depending on the design of the EMI filter unit 20, the isolation resistance and the level of the low-voltage output 15. Hence, the isolation resistance test can be performed very quickly for enabling improved safety in case of isolation resistance fault.

Alternatively, detection of an isolation fault may be determined by determining a difference in timing until the first and second capacitors, respectively, has reached a predetermined charging current, voltage level or energy level, and if the difference is larger than a predetermined threshold value determine that an isolation fault is present.

Figure 4:
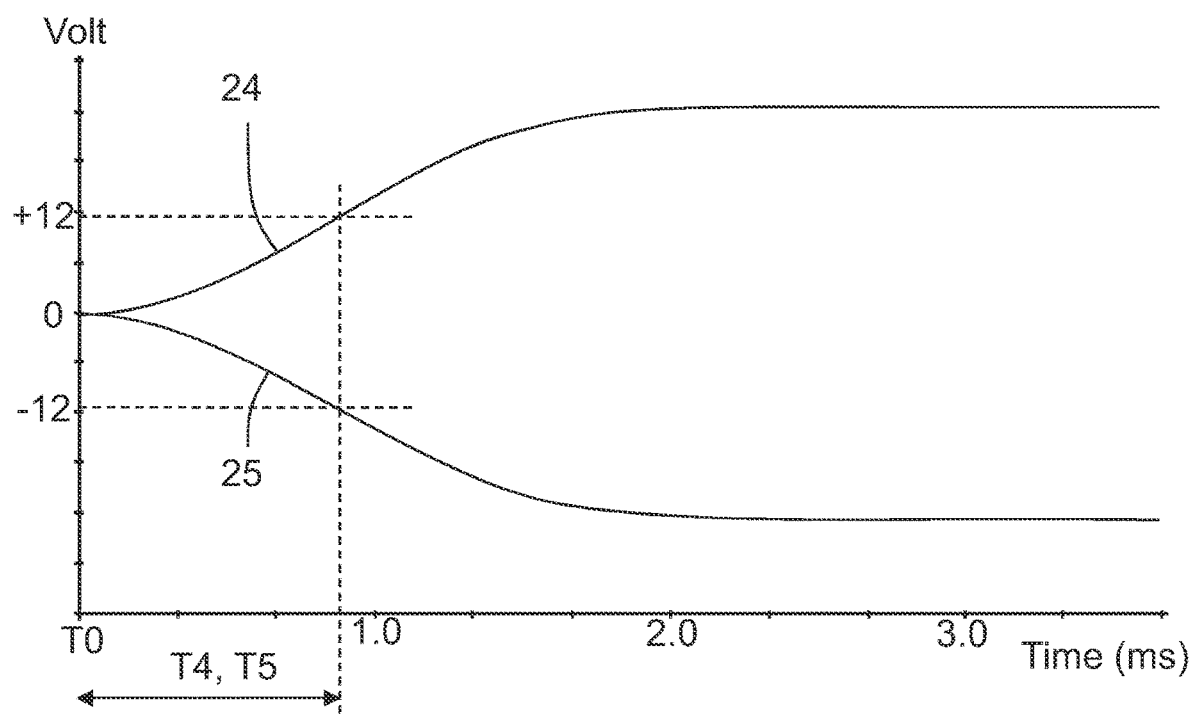
FIGS. 4-5 show a second example embodiment for determining whether an isolation resistance fault is present or not.
Figure 5:
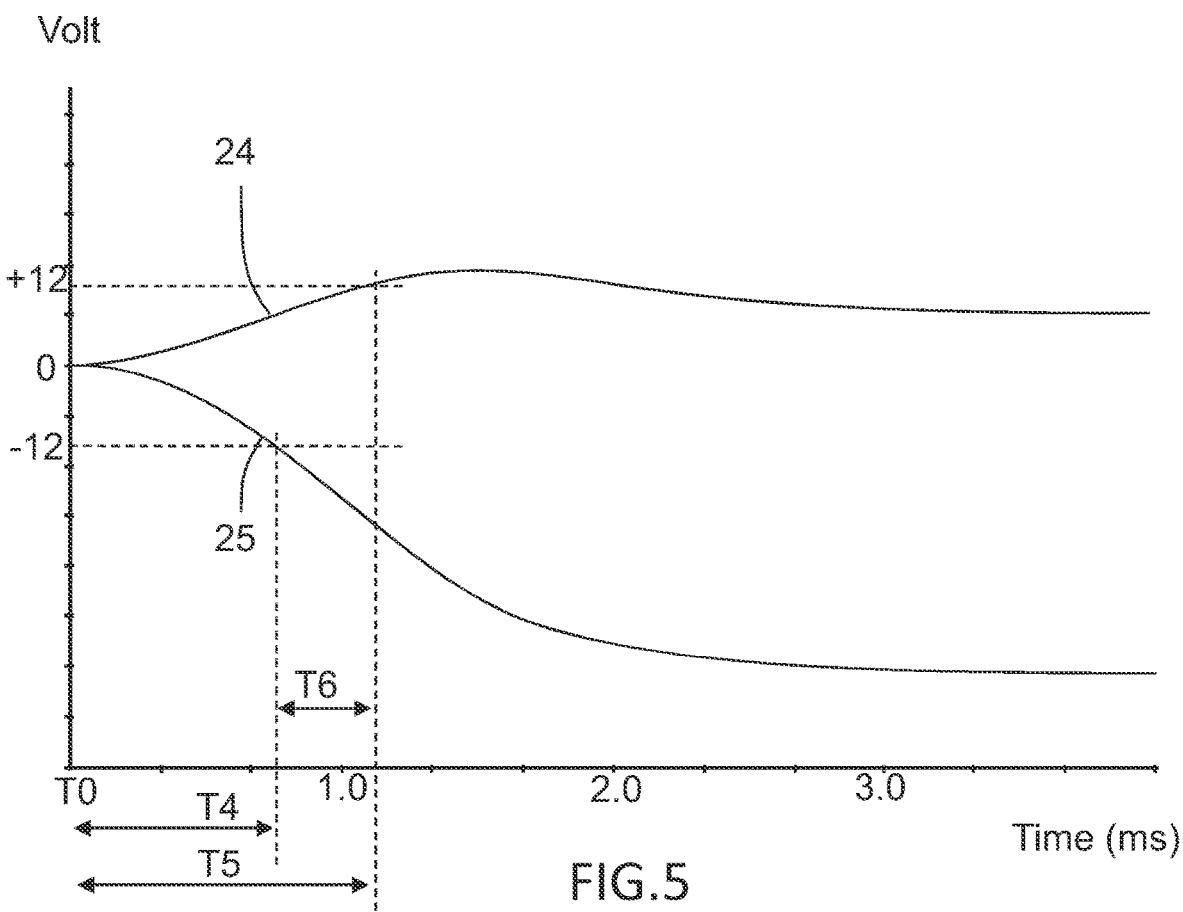

For example, as schematically illustrated in FIGS. 4 and 5, the high-voltage circuit may be configured to detect a first time period T4 required for the first voltage 24 of the first capacitor 9 to reach a predetermined value, and a second time period T5 required for the second voltage 25 of the second capacitor 10 to reach said predetermined value, but with reversed polarity. As shown in FIG. 4, the predetermined value may for example be +12 volt and −12 volt, respectively.

In a high-voltage circuit having a faultless isolation resistance, as shown in FIG. 4, the difference in timing between the first and second time period T4, T5 will be substantially zero, i.e. less than a than a predetermined threshold value, and the electronic controller 16 may conclude that no isolation fault is present.

On the other hand, in a high-voltage circuit having a faulty isolation resistance, as shown in FIG. 5, the time difference T6 between the first and second time period T4, T5 will be relatively large, i.e. larger than a predetermined threshold value, and the electronic controller 16 will thus conclude that an isolation fault is present.

Figure 6:
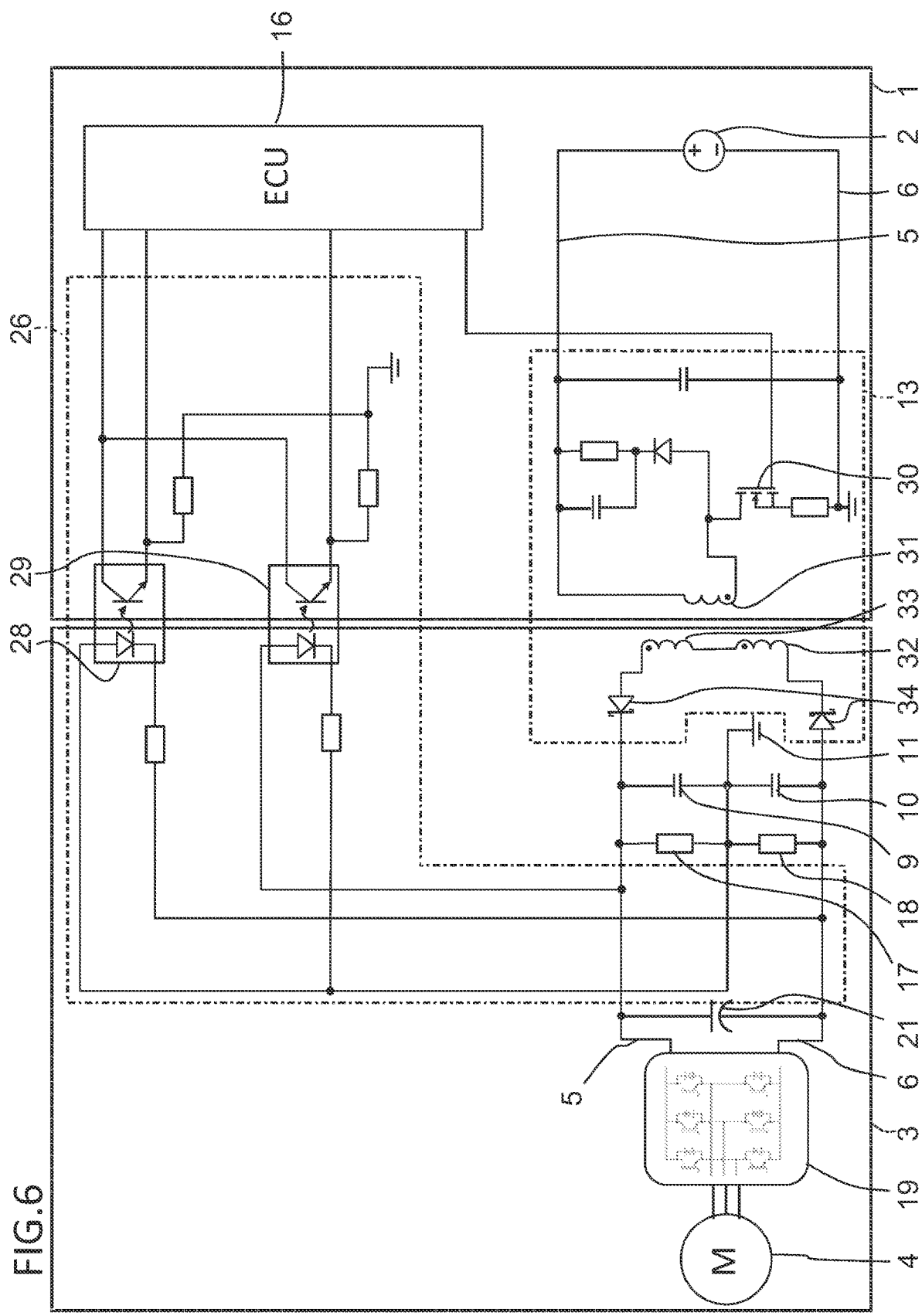
FIG. 6 shows a more detailed view of an example embodiment of the DC/DC converter and the isolated sensing circuit.

FIG. 6 shows an example embodiment of an implementation of an isolated DC/DC converter 13 and a solution for enabling the electronic controller 16 to register a voltage level of the first and second capacitors 9, 10 by means of an isolated sensing circuit 26.

According to this example embodiment, an isolation fault may be determined by determining a difference in timing until the first and second capacitors, respectively, has reached a predetermined charging voltage level. This may be particularly cost-efficiently implemented by means of first and second optocouplers (opto isolators) 28, 29, which comprises light-emitting diode (LED) that converts electrical input signal into light, and a photo sensor, which detects incoming light and modulates an electric signal supplied to the electronic controller 16.

The output signal of the first and second optocouplers 28, 29 is an analogue signal whose strength depends on the voltage level over the first and second capacitors 9, 10. The output signal may be supplied directly to an integrated AD/DC converter of the electronic controller 16 for enabling the electronic controller 16 to determine, by means of suitable logic, the difference in timing until the first and second capacitors, respectively, has reached a predetermined charging voltage level. This design enables relatively cost-efficient and straightforward use of the electronic controller 16 for determining a difference in timing merely be monitoring the output of the first and second optocouplers 28, 29.

Alternatively, the output signal of the first and second optocouplers 28, 29 may be supplied to an intermediate AD/DC converter and comparator circuit, which subsequently supplies a signal to the electronic controller 16 indicating the difference in timing until the first and second capacitors, respectively, has reached a predetermined charging voltage level.

The isolated DC/DC converter 13 has an isolated topology in form of Flyback, Forward, Push-Pull, Half-Bridge or Resonant LLC topology. These topologies are all, as such, well known to the person skilled in the art, each having its own advantages and disadvantages. For example, the Flyback topology, as shown in the example embodiment of FIG. 6, is known for its cost-efficient and non-complex design.

The DC/DC converter 13 comprises a switching transistor 30, for example in in form of a MOSFET, which controls the current through the primary coil 31 of the transformer. In the example embodiment of the DC/DC converter the transformer comprises two secondary coils 32, 33 connected in series but the DC/DC converter may alternatively be implemented using a single secondary coil in the transformer. The DC/DC converter 13 according to the example embodiment of FIG. 6 further comprises two Schottky diodes 34 for rectification of the output voltage.

Moreover, isolated DC/DC converters may be implemented in very compact format, sometimes referred to a micro DC/DC converter. Such an isolated micro DC/DC converter may be implemented on a single chip comprising a micro-transformer, switching transistor and Schottky diodes for rectification. In fact, the complete isolated micro DC/DC converter may for example be packaged as a single integrated circuit.

High level of isolation may be accomplished using an isolation layer sandwiched in between the primary coil and secondary coil of the transformer.

The electronic controller 13 is configured for controlling an electrical power level that is transferred from a primary side of the DC/DC converter 13 to a secondary side of the DC/DC converter by controlling the PWM duty cycle of the switching transistor 30. The switching transistor 30 may for example have a 500 kHz switching frequency.

The isolated sensing circuit 26 is configured for supplying feedback information regarding charging current, voltage level or energy level of each of the first and second capacitors 9, 10 to the electronic controller. The isolated sensing circuit 26 may for example be implemented by means of first and second optocouplers 28, 29, as described above. Alternatively, the isolated sensing circuit 26 may comprise a digital isolator device on an integrated circuit. All these components could provide the necessary feedback information while offering high level of electrical isolation between the high-voltage battery side 1 and the high-voltage propulsion side 3.

The electrical isolation between the high-voltage battery side 1 and the high-voltage propulsion side 3 of the electrical sensing circuit may for example be implemented using light communication, as in the optocouplers 28, 29, RF communication, magnetic field communication or the like.

Furthermore, the isolated sensing circuit 26 may be implemented together with an isolated micro DC/DC converter 13 on a single chip.

Figure 7:
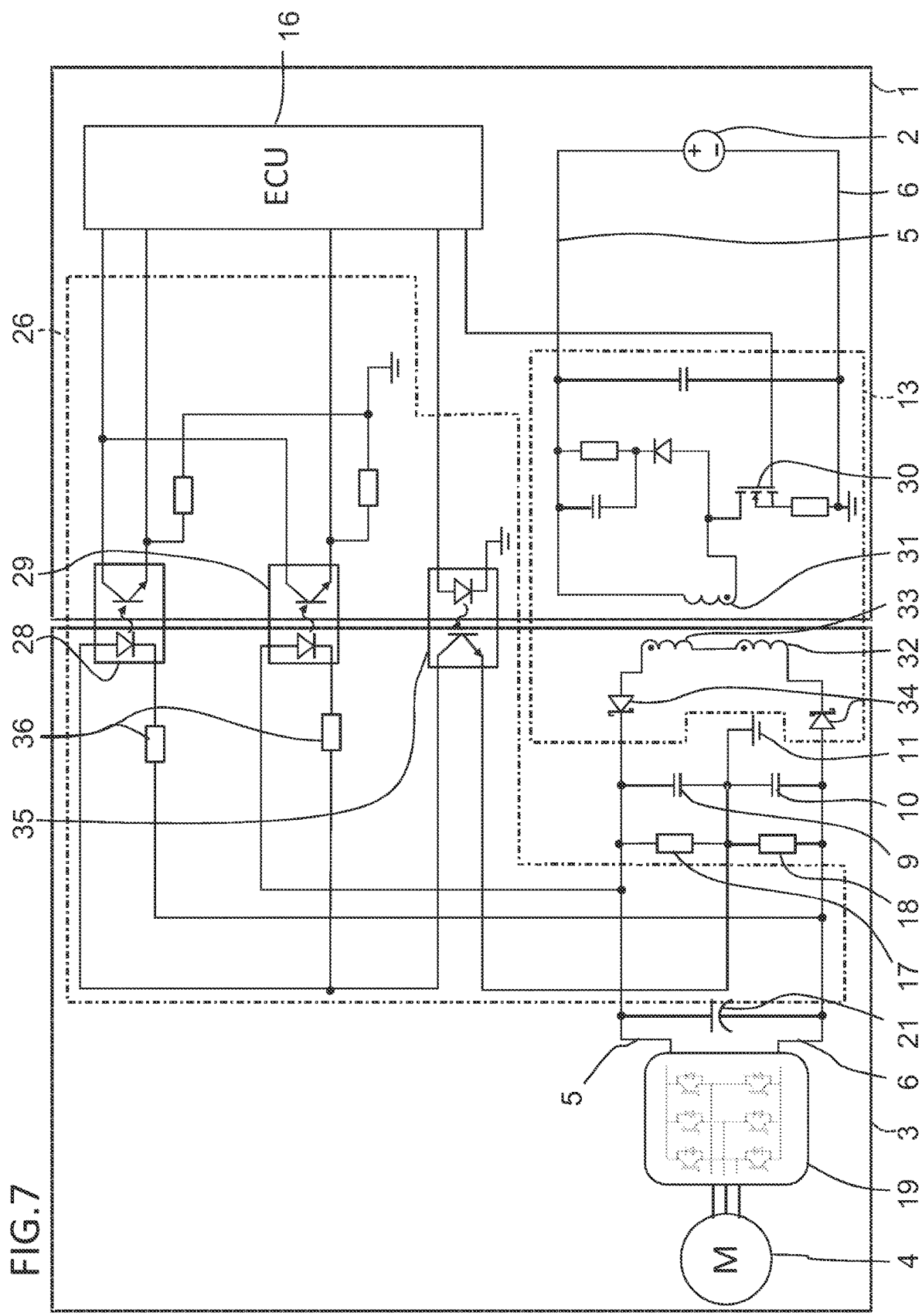
FIG. 7 shows a more detailed view of a further example embodiment of the isolated sensing circuit.

As schematically shown in the example embodiment of FIG. 7, the high-voltage circuit may further comprise a switch 35 located in the isolated sensing circuit 26 for enabling disconnection of the first and second optocouplers 28, 29 from the first and second capacitors 9, 10 when no detection of an isolation fault in an isolation resistance between a positive and negative high-voltage bus rail 5, 6 and a vehicle chassis is performed. Thereby, losses in the resistors 36 connected in series with the first and second optocoupler 28, 29 may be avoided in normal operating mode of the high-voltage circuit.

The switch may also be implemented in form of an optocoupler for ensuring sufficient isolation between the high-voltage battery side 1 and the high-voltage propulsion side 3.

The disclosure also concerns a method for detecting an isolation fault in an isolation resistance 17, 18 between a positive and negative high-voltage bus rail 5, 6 and a vehicle chassis on a high-voltage propulsion side 3 of a high-voltage system of an electric or hybrid-electric vehicle according to the description above.

A first example embodiment of the method comprising five steps will be described below with reference to FIG. 8. The method comprises a first step 81 of ensuring that first and second high-voltage contactors 7, 8 are set in an open state. This may for example involve checking the current setting of the first and second high-voltage contactors 7, 8, and to switch the first and second high-voltage contactors 7, 8 to an open state if they are in a closed state.

The second step 82 involves operating the isolated DC/DC converter 13 for converting a supplied high-voltage input 14 from a high-voltage battery 2 of the high-voltage battery side 1 to a low-voltage output 15 on the high-voltage propulsion side 3. This is typically performed by operating the switching transistor 30 of the DC/DC converter 13 with a suitable switching frequency and PWM duty cycle, such that the desired amount of energy is transferred from the primary coil 31 to the secondary coils 32, 33.

The third step 83 involves simultaneously supplying the low-voltage output to the first and second capacitors 9, 10 for simultaneous charging of the first and second capacitors 9, 10. At time T0 the charging current is high and the voltage over the first and second capacitors 9, 10 substantially zero, and after a small time period when the first and second capacitors 9, 10 are fully charged the charging current is substantially zero and the voltage over the first and second capacitors 9, 10 has stabilized at a final voltage, which depends on the resistance levels of the first and second isolation resistances 17, 18.

The fourth step 84 involves registering a charging current, voltage level or energy level of the first and second capacitors 9, 10. This may for example be implemented using a current sensor for registering the charging current of the first and second capacitors 9, 10, or a voltage sensor for registering the voltage level of the first and second capacitors 9, 10, or a combination of both for registering the energy level of the first and second capacitors 9, 10.

Finally, the fifth step 85 involves determining, based in the registered charging current, voltage level or energy level of the first and second capacitors 9, 10, whether an isolation fault between the positive and/or negative high-voltage bus rail 5, 6 and the vehicle chassis on the high-voltage propulsion side 3 of the high-voltage system is present.

The fifth step may for example be performed by determining a difference in timing until the first and second capacitors 9, 10, respectively, has reached a predetermined charging current, voltage level or energy level, and if the difference is larger than a predetermined threshold value the electronic controller 16 can determine that an isolation fault is present Alternatively, the fifth step may for example be performed by determining a difference in charging current, voltage level or energy level of the first and second capacitors 9, 10 after a predetermined time period, and if the difference is larger than a predetermined threshold value the electronic controller 16 may determine that an isolation fault is present.

Still more alternatively, the fifth step may for example be performed by determining a difference in a registered charging current characteristic over time, voltage level characteristic over time or energy level characteristic over time of the first and second capacitors, and if the difference is larger than a predetermined threshold value the electronic controller 16 may determine that an isolation fault is present.

A second example embodiment of the method according to the disclosure will be described below with reference to FIG. 9. The method comprises a first step 91 of ensuring that first and second high-voltage contactors are set in an open state, a second step 92 of operating an isolated DC/DC converter for converting a supplied high-voltage from a high-voltage battery of the high-voltage battery side to a low-voltage output on the high-voltage propulsion side, a third step 93 of supplying the low-voltage output to the first capacitor for charging of the first capacitor, a fourth step 94 of registering a charging current, voltage level or energy level of the first capacitor, a fifth step 95 of supplying the low-voltage output to the second capacitor for charging of the second capacitor, a sixth step 96 of registering a charging current, voltage level or energy level of the second capacitor, and a seventh step 97 of determining, based in the registered charging current, voltage level or energy level of the first and second capacitors, whether an isolation fault between the positive and/or negative high-voltage bus rail and the vehicle chassis on the high-voltage propulsion side of the high-voltage system is present.

The main difference between the first and second example embodiments is thus whether to supply low-voltage to both the first and second capacitors 9, 10 simultaneously as in the first example embodiment, or to supply the low-voltage to the first and second capacitors 9, 10 consecutively as in the second example embodiment. Both methods has some advantages and disadvantages.

For example, the first example embodiment enables a quicker isolation resistance fault detection, but has the disadvantage that a symmetrical isolation resistance fault, i.e. when both the first and second isolation resistance 17, 18 has same fault, cannot be detected. The second example embodiment takes more time for isolation resistance fault detection due to the consecutive testing of the first and second capacitors 9, 10, and because all capacitors of the EMI filter unit 20 after testing of the first capacitor 9 must be given time to discharge before initiating testing of the second capacitor 10. However, the second example embodiment has the advantage that a symmetrical isolation resistance fault can be detected.

A high-voltage circuit suitable for implementing the second example embodiment of the method described above may for example include two isolated DC/DC converters, one isolated DC/DC converter for isolation resistance 17, 18.

The fifth step 85 of FIG. 8 and the seventh step 97 of FIG. 9 of determining whether an isolation fault is present may include classifying a detected isolation fault in one of at least two isolation fault classes representing different levels of isolation fault severity. As a result, different actions may be taken by the electronic controller 16 depending on the severity of the isolation resistance fault. For example, a detected isolation fault that becomes classified in a low severity class may result in a lighting of a service lamp on the instrumentation of the vehicle for informing the user or service personnel or a fleet manager about the fault, while still allowing the first and second high-voltage contactors 7, 8 to be closed for driving of the vehicle, and detected isolation fault that becomes classified in a high severity class may result in prohibited closing of the first and second high-voltage contactors 7, 8.

The second step 82, 92 of the first and second example embodiments of FIGS. 8 and 9 may comprise operating the isolated DC/DC converter 13 in a first mode for converting the supplied high-voltage from a high-voltage battery 2 to the low-voltage output 15, wherein the first mode involves executing a first pulse width modulation process having primarily a first switching frequency and a first duty-cycle, and if an isolation resistance fault is detected, each of the first and second embodiments of FIGS. 8 and 9 may include a further step of operating the isolated DC/DC converter in a second mode, which involves executing a second pulse width modulation process having primarily a second switching frequency and a second duty-cycle. By operating the isolated DC/DC converter 13 in a first mode and subsequently in a second more information about the isolation resistance fault may be acquired for determining the providing a better evaluation of the severity of the isolation resistance fault.

Each of the first and second embodiments of FIGS. 8 and 9 may include a further step of disconnecting the isolated sensing circuit 26 from the first and second capacitors 9, 10 when no detection of an isolation fault in an isolation resistance between a positive and negative high-voltage bus rail 5, 6 and a vehicle chassis is performed. Thereby, unnecessary losses in the resistance 36 connected in series with the first and second optocoupler 28, 29 may be avoided in normal operating mode of the high-voltage circuit.

An isolated switch 35, in particular a third optocoupler, may be used for enabling disconnection the isolated sensing circuit 26 from the first and second capacitors 9. This may be implemented by placing the third optocoupler 35 in series with each of the first and second optocouplers 28, 29 and supplying an input signal to the third optocoupler 35 from the electronic controller 16 for controlling the degree of saturation of the transistor of the third optocoupler 35, wherein the degree of saturation effectively corresponds to the degree of connection of the first and second optocouplers 28, 29 with the first and second capacitors 9.

The isolated sensing circuit 26 may for example be implemented together with a micro DC/DC converter on a single chip for improved cost-efficiency and packaging.

The electronic controller 16 described with reference to FIG. 1-7 is further configured for performing the method as described above.

Although the disclosure has been described in relation to specific combinations of components, it should be readily appreciated that the components may be combined in other configurations as well which is clear for the skilled person when studying the present application. Thus, the above description of the example embodiments of the present disclosure and the accompanying drawings are to be regarded as a non-limiting example of the disclosure and the scope of protection is defined by the appended claims. Any reference sign in the claims should not be construed as limiting the scope.

Although discussed above as methods described by the flowchart of FIGS. 8 and 9, it should be appreciated that one or more operations may be omitted from the methods discussed. Further, the operations may be performed in any order and do not necessarily imply an order as provided. Rather, the methods discussed are merely one embodiment of the present disclosure as contemplated.

What is claimed is:

1. A method for detecting an isolation fault in an isolation resistance between a positive and negative high-voltage bus rail and a vehicle chassis on a high-voltage propulsion side of a high-voltage system of an electric or hybrid-electric vehicle,
   wherein the high-voltage system is split into a high-voltage battery side and the high-voltage propulsion side by means of first and second high-voltage contactors located in the positive and negative high-voltage bus rails, respectively,
   wherein the high-voltage propulsion side comprises a first and second capacitors connected in series across the positive and negative high-voltage bus rails, and
   wherein a common junction of the first and second capacitors is connected to the chassis,
   the method comprising:
   ensuring that first and second high-voltage contactors are set in an open state,
   operating an isolated DC/DC converter for converting a supplied high-voltage from a high-voltage battery of the high-voltage battery side to a low-voltage output on the high-voltage propulsion side,
   supplying the low-voltage output to the positive and negative high-voltage bus rails for simultaneous charging of the first and second capacitors,
   registering a charging current, voltage level or energy level of the first and second capacitors, and
   determining, based in the registered charging current, voltage level or energy level of the first and second capacitors, whether an isolation fault between the positive and/or negative high-voltage bus rail and the vehicle chassis on the high-voltage propulsion side of the high-voltage system is present.

2. The method according to claim 1, wherein the step of determining whether an isolation fault is present is performed by:
   determining a difference in timing until the first and second capacitors, respectively, has reached a predetermined charging current, voltage level or energy level, and if the difference is larger than a predetermined threshold value determining that an isolation fault is present, or
   determining a difference in charging current, voltage level or energy level of the first and second capacitors after a predetermined time period, and if the difference is larger than a predetermined threshold value determining that an isolation fault is present, or
   determining a difference in a registered charging current characteristic over time, voltage level characteristic over time or energy level characteristic over time of the first and second capacitors, and if the difference is larger than a predetermined threshold value determining that an isolation fault is present.

3. A method for detecting an isolation fault in an isolation resistance between a positive and negative high-voltage bus rail and a vehicle chassis on a high-voltage propulsion side of high-voltage system of an electric or hybrid-electric vehicle,
   wherein the high-voltage system is split into a high-voltage battery side and the high-voltage propulsion side by means of first and second high-voltage contactors located in the positive and negative high-voltage bus rails, respectively,
   wherein the high-voltage propulsion side comprises a first and second capacitors connected in series across the positive and negative high-voltage bus rails, and
   wherein a common junction of the first and second capacitors is connected to the chassis,
   the method comprising:
   ensuring that first and second high-voltage contactors are set in an open state,
   operating an isolated DC/DC converter for converting a supplied high-voltage from a high-voltage battery of the high-voltage battery side to a low-voltage output on the high-voltage propulsion side,
   supplying the low-voltage output to the first capacitor for charging of the first capacitor,
   registering a charging current, voltage level or energy level of the first capacitor,
   supplying the low-voltage output to the second capacitor for charging of the second capacitor,
   registering a charging current, voltage level or energy level of the second capacitor,
   and
   determining, based in the registered charging current, voltage level or energy level of the first and second capacitors, whether an isolation fault between the positive and/or negative high-voltage bus rail and the vehicle chassis on the high-voltage propulsion side of the high-voltage system is present.

4. The method according to claim 1, wherein the step of determining whether an isolation fault is present includes classifying a detected isolation fault in one of at least two isolation fault classes representing different levels of isolation fault severity.

5. The method according to claim 4, wherein the method further comprising preventing closing of the first and second high-voltage contactors when a detection isolation fault is classified in a high severity class, and allowing closing of the first and second high-voltage contactors when a detected isolation fault is classified in a low severity class.

6. The method according to claim 1, wherein the isolated DC/DC converter includes an electrical transformer for converting the supplied high-voltage from the high-voltage battery to the low-voltage output.

7. The method according to claim 1, comprising
   controlling an electrical power level that is transferred from a primary side of the DC/DC converter to a secondary side of the DC/DC converter by means of the electronic controller, and
   supplying feedback information regarding charging current, voltage level or energy level of each of the first and second capacitors to the electronic controller by means of an isolated sensing circuit.

8. The method according to claim 7, wherein the isolated sensing circuit is implemented by means of an optocoupler or a digital isolator device on an integrated circuit.

9. The method according to claim 7, comprising at least partly disconnecting the isolated sensing circuit from the first and second capacitors when no detection of an isolation fault in an isolation resistance between a positive and negative high-voltage bus rail and a vehicle chassis is performed.

10. The method according to claim 1, wherein the step of operating an isolated DC/DC converter for converting a supplied high-voltage from a high-voltage battery of the high-voltage battery side to a low-voltage output on the high-voltage propulsion side involves executing a first pulse width modulation process, and if an isolation fault is detected, executing a second pulse width modulation process for acquiring more information about the isolation fault.

11. A high-voltage circuit of an electric or hybrid-electric vehicle, the high-voltage circuit comprising:

a high-voltage battery side including a high-voltage battery, a high-voltage propulsion side including an electrical propulsion motor and an electrical motor controller associated with electrical propulsion motor, a positive and a negative high-voltage bus rail connecting the high-voltage battery with the electrical motor controller, a first and a second high-voltage contactor located in the positive and the negative high-voltage bus rail, respectively, and defining a split between the high-voltage battery side and the high-voltage propulsion side, a first and a second capacitor located on the high-voltage propulsion side and connected in series across the positive and negative high-voltage bus rails, wherein a common junction of the first and second capacitors is connected to the chassis, an isolated DC/DC converter having a high-voltage input connected to the high-voltage battery and a low-voltage output connected to the positive and negative high-voltage bus rails on the high-voltage propulsion side, and an electronic controller configured for operating the isolated DC/DC converter and detecting an isolation fault in an isolation resistance between the positive and negative high-voltage bus rail and the vehicle chassis on the high-voltage propulsion side while having the first and second high-voltage contactors set in an open state.

12. The high-voltage circuit according to claim 11, wherein the electronic controller is configured for controlling an electrical power level that is transferred from a primary side of the DC/DC converter to a secondary side of the DC/DC converter, and wherein the high-voltage circuit further comprises an isolated sensing circuit configured for supplying feedback information regarding charging current, voltage level or energy level of each of the first and second capacitors to the electronic controller.

13. The high-voltage circuit according to claim 12, further comprising a switch located in the isolated sensing circuit for enabling at least part disconnection of the isolated sensing circuit from the first and second capacitors when no detection of an isolation fault in an isolation resistance between a positive and negative high-voltage bus rail and a vehicle chassis is performed.

14. The high-voltage circuit according to claim 11, wherein the electronic controller is configured for:
ensuring that first and second high-voltage contactors are set in an open state;
operating the isolated DC/DC converter for converting a supplied high-voltage from the high-voltage battery to a low-voltage output;
simultaneously supplying the low-voltage output to the first and second capacitors for simultaneous charging of the first and second capacitors,
registering a charging current, voltage level or energy level of the first and second capacitors, and
determining, based in the registered charging current, voltage level or energy level of the first and second capacitors, whether an isolation fault between the positive and/or negative high-voltage bus rail and the vehicle chassis on the high-voltage propulsion side of the high-voltage system is present.

15. The high-voltage circuit according to claim 11, wherein the electronic controller is configured for:
ensuring that first and second high-voltage contactors are set in an open state;
operating an isolated DC/DC converter for converting a supplied high-voltage from a high-voltage battery of the high-voltage battery side to a low-voltage output;
supplying the low-voltage output to the first capacitor for charging of the first capacitor,
registering a charging current, voltage level or energy level of the first capacitor,
supplying the low-voltage output to the second capacitor for charging of the second capacitor,
registering a charging current, voltage level or energy level of the second capacitor, and
determining, based in the registered charging current, voltage level or energy level of the first and second capacitors, whether an isolation fault between the positive and/or negative high-voltage bus rail and the vehicle chassis on the high-voltage propulsion side of the high-voltage system is present.

* * * * *